US009204568B2

(12) United States Patent
Lerenthal

(10) Patent No.: US 9,204,568 B2
(45) Date of Patent: Dec. 1, 2015

(54) SUPPLEMENTARY ELEMENTS FOR A HANDHELD DEVICE AND METHODS OF MANUFACTURING THEREOF

(71) Applicant: Freeway Design end Development Ltd., Tel-Aviv (IL)

(72) Inventor: Moran Lerenthal, Tel-Aviv (IL)

(73) Assignee: Freeway Design end Development Ltd., Tel-Aviv (IL)

( * ) Notice: Subject to any disclaimer, the term of this patent is extended or adjusted under 35 U.S.C. 154(b) by 386 days.

(21) Appl. No.: 13/889,376

(22) Filed: May 8, 2013

(65) Prior Publication Data

US 2014/0192493 A1    Jul. 10, 2014

Related U.S. Application Data

(60) Provisional application No. 61/750,482, filed on Jan. 9, 2013.

(51) Int. Cl.
| | |
|---|---|
| G06F 1/16 | (2006.01) |
| H05K 7/06 | (2006.01) |
| H05K 13/00 | (2006.01) |
| H04M 1/725 | (2006.01) |
| H04M 1/02 | (2006.01) |

(52) U.S. Cl.
CPC ............... *H05K 7/06* (2013.01); *G06F 1/1632* (2013.01); *G06F 1/1635* (2013.01); *G06F 1/1656* (2013.01); *H04M 1/72527* (2013.01); *H05K 13/00* (2013.01); *H04M 1/0254* (2013.01); *H04M 1/0274* (2013.01); *H04M 1/72575* (2013.01); *H04M 2250/04* (2013.01); *Y10T 29/4913* (2015.01)

(58) Field of Classification Search
CPC .... G06F 1/1632; G06F 1/1635; G06F 1/1656
USPC .......................... 361/679.41–679.45, 679.56
See application file for complete search history.

(56) References Cited

U.S. PATENT DOCUMENTS

| | | | |
|---|---|---|---|
| 6,626,362 B1 | 9/2003 | Steiner et al. | |
| 6,914,777 B2 * | 7/2005 | Hsu | 361/679.4 |
| 7,778,023 B1 * | 8/2010 | Mohoney | 361/679.41 |
| 8,367,235 B2 * | 2/2013 | Huang | 429/96 |
| 8,390,255 B1 * | 3/2013 | Fathollahi | 320/115 |
| 8,483,758 B2 * | 7/2013 | Huang | 455/557 |
| 8,611,075 B2 * | 12/2013 | Carter | 361/679.01 |
| 8,638,557 B2 * | 1/2014 | Tsai | 361/679.56 |
| 8,640,868 B2 * | 2/2014 | O'Dowd et al. | 206/320 |
| 8,749,970 B2 * | 6/2014 | Petersson et al. | 361/679.56 |
| 8,964,364 B2 * | 2/2015 | Abdelsamie et al. | 361/679.03 |
| 8,971,039 B2 * | 3/2015 | Huang et al. | 361/679.56 |

(Continued)

*Primary Examiner* — Ramon Barrera

(57) ABSTRACT

A supplementary element sized and shaped to fit between a back side of a handheld device and a handheld device cover. The supplementary element comprises a board having at least one electronic component which are permanently assembled, the board is sized and shaped to fit between a back side of a handheld device and a handheld device cover while the handheld device cover is tightly coupled to a lateral side of the handheld device, the lateral side having an opening of a lateral female connector, a connector element having a male connector that is electronically connected to the at least one electronic component and configured to be connected to the lateral female connector, and a lateral mount mechanically connected to the board and fixates a tip of the male connector to face the lateral female connector when the board is placed over and in parallel to the back side.

18 Claims, 4 Drawing Sheets

(56) References Cited

U.S. PATENT DOCUMENTS

| | | | |
|---|---|---|---|
| 2006/0092602 A1* | 5/2006 | Hou et al. | 361/679 |
| 2007/0247136 A1* | 10/2007 | Wallmark et al. | 323/371 |
| 2008/0123287 A1* | 5/2008 | Rossell et al. | 361/686 |

* cited by examiner

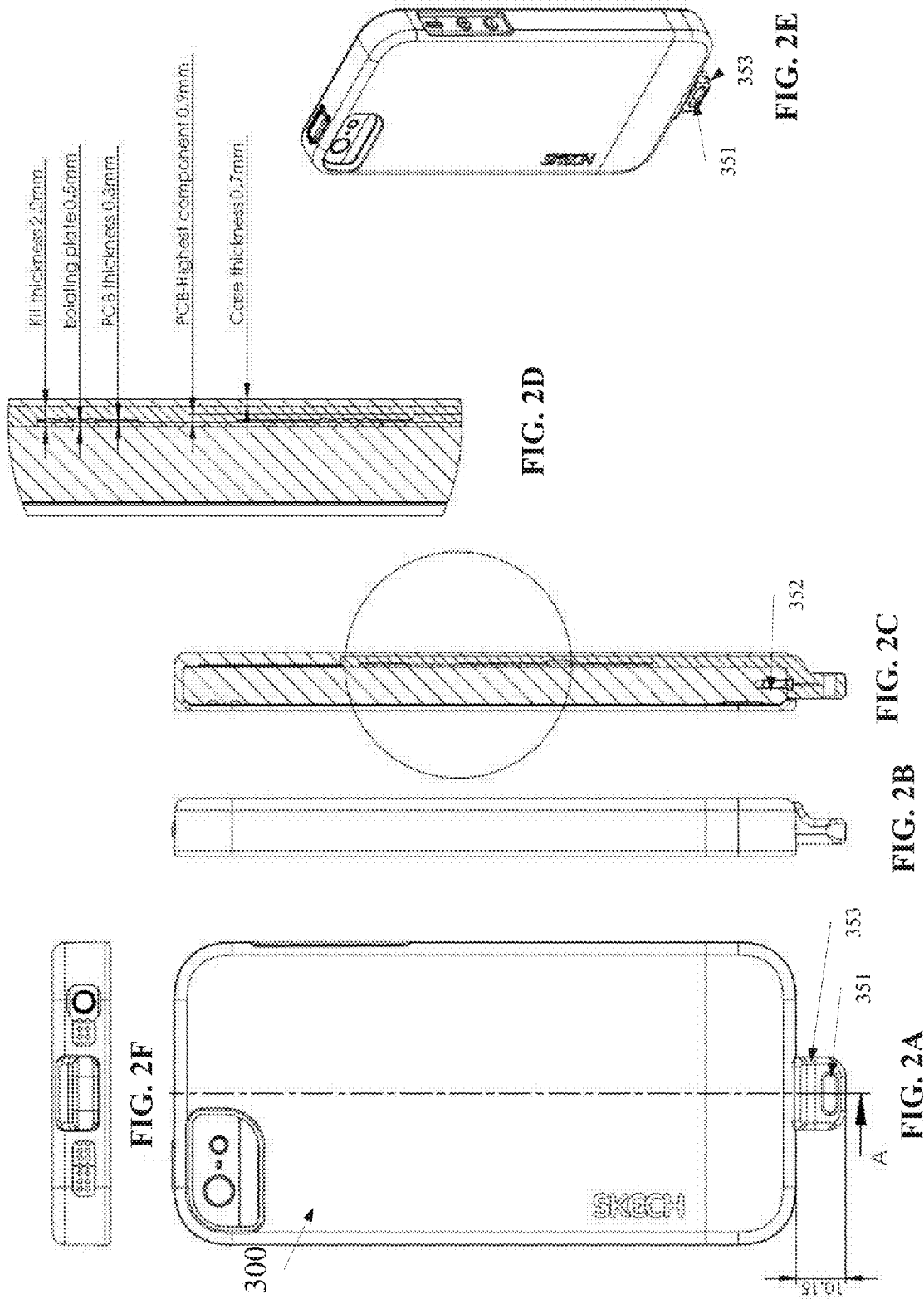

SUPPLEMENTARY ELEMENTS FOR A HANDHELD DEVICE AND METHODS OF MANUFACTURING THEREOF

RELATED APPLICATION

This application claims the benefit of priority under 35 USC 119(e) of U.S. Provisional Patent Application No. 61/750,482 filed Jan. 9, 2013, the contents of which are incorporated herein by reference in their entirety.

FIELD AND BACKGROUND OF THE INVENTION

The present invention, in some embodiments thereof, relates to handheld devices and, more particularly, but not exclusively, to handheld devices which are protected by protective covers.

Handheld devices, such as mobile phones, personal organizers, tablets and/or the like have become popular for communication, browsing and application execution in a highly portable way. For protecting a handheld device from damage that may occur through inadvertent dropping or collision with other items a protective cover is usually used. Such resilient protective cover is usually designed to provide protection without impeding use of the handheld device with the protective cover in place.

For example U.S. Pat. No. 6,626,362 teaches a protective cover which is formed as a shell of resilient material that overlies the side, rear, top and bottom surfaces of the handheld device. A top wall of the shell includes a peripheral portion that overlies the edge of the front surface of the handheld device such that the top, bottom and side surfaces of the handheld device are received in a peripheral recess.

SUMMARY OF THE INVENTION

According to some embodiments of the present invention, there are provided a supplementary element sized and shaped to fit between a back side of a handheld device and a handheld device cover while the handheld device cover is on the handheld device. The supplementary element comprises a board having at least one electronic component which are permanently assembled, the board is sized and shaped to fit between a back side of a handheld device and a handheld device cover while the handheld device cover is tightly coupled to a lateral side of the handheld device, the lateral side having an opening of a lateral female connector, a connector element having a male connector that is electronically connected to the at least one electronic component and configured to be connected to the lateral female connector, and a lateral mount mechanically connected to the board and fixates a tip of the male connector to face the lateral female connector when the board is placed over and in parallel to the back side.

Optionally, the board comprises a printed circuit board (PCB) in which the at least one electronic component is wired.

Optionally, the board having a first width and height which are shorter than a second width and height of the handheld device.

Optionally, the board having a thickness of less than 0.6 centimeter.

Optionally, the board having a thickness of less than 0.3 centimeter.

Optionally, the lateral female connector comprises a power connector.

Optionally, the lateral mount is sized and shaped to pass through in an opening of a single piece handheld device cover, the single piece handheld device cover is sized and shaped to be tightly coupled to the back side and the opening is sized to encircle the lateral female connector.

Optionally, the at least one electronic component comprises at least one inductive coil and at least one charging circuit electronically connected to the male connector.

Optionally, the at least one electronic component comprises a wireless communication module for establishing a wireless communication with at least one of a proximate device and a tag.

More optionally, the wireless communication module is a near field communication (NFC) module.

More optionally, the wireless communication module is a radio frequency identifier (RFID) tag.

Optionally, the at least one electronic component comprises at least one electrochemical cell.

Optionally, the lateral mount having an aperture that is sized and shaped to receive a cord.

Optionally, the handheld device cover having a frame structure that supports a replaceable back cover, the board being integrated into the replaceable back cover.

Optionally, the replaceable back cover having a recess that matches a lateral projection in the frame structure.

According to some embodiments of the present invention, there are provided a supplementary element for a handheld device. The supplementary element comprises a board having a thickness of less than 0.6 centimeter and a first width and height which are shorter than a second width and height of a handheld device having a back side, a front side, and a lateral side having an opening of a lateral female connector, and a lateral mount that is mechanically connected to the board having an aperture that is sized and shaped to receive a cord. The supplementary element is sized and shaped to fit between the back side and a handheld device cover while the handheld device cover is tightly coupled to the lateral side and so that the lateral mount is located to cover the opening.

Optionally, the lateral mount is sized and shaped to pass through in an opening of a single piece handheld device cover, the single piece handheld device cover is sized and shaped to be tightly coupled to the back side and the opening is sized to encircle the lateral female connector.

According to some embodiments of the present invention, there are provided a method of manufacturing a supplementary element for a handheld device. The method comprises fabricating a board having at least one electronic component which are permanently assembled thereto, the board having a thickness of less than 0.6 centimeter and a first width and height which are shorter than a second width and height of a handheld device having a back side, a front side, and a lateral side having an opening of a lateral female connector, electronically connecting a connector element having a male connector configured to be connected to the lateral female connector to the at least one electronic component, and mechanically connecting a lateral mount to the board so that the lateral mount fixates a tip of the male connector to face the lateral female connector when the board is placed over and in parallel to the back side. The supplementary element is sized and shaped to fit between the back side and a handheld device cover while the handheld device cover is tightly coupled to the lateral side.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

Implementation of the method and/or system of embodiments of the invention can involve performing or completing selected tasks manually, automatically, or a combination thereof. Moreover, according to actual instrumentation and equipment of embodiments of the method and/or system of the invention, several selected tasks could be implemented by hardware, by software or by firmware or by a combination thereof using an operating system.

For example, hardware for performing selected tasks according to embodiments of the invention could be implemented as a chip or a circuit. As software, selected tasks according to embodiments of the invention could be implemented as a plurality of software instructions being executed by a computer using any suitable operating system. In an exemplary embodiment of the invention, one or more tasks according to exemplary embodiments of method and/or system as described herein are performed by a data processor, such as a computing platform for executing a plurality of instructions. Optionally, the data processor includes a volatile memory for storing instructions and/or data and/or a non-volatile storage, for example, a magnetic hard-disk and/or removable media, for storing instructions and/or data. Optionally, a network connection is provided as well. A display and/or a user input device such as a keyboard or mouse are optionally provided as well.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIGS. 2A-2F are schematic illustrations of a supplementary element located between a back side of an exemplary handheld device (e.g. Smartphone) and a handheld device cover (e.g. single piece cover), according to some embodiments of the present invention;

DESCRIPTION OF EMBODIMENTS OF THE INVENTION

Figure 1:
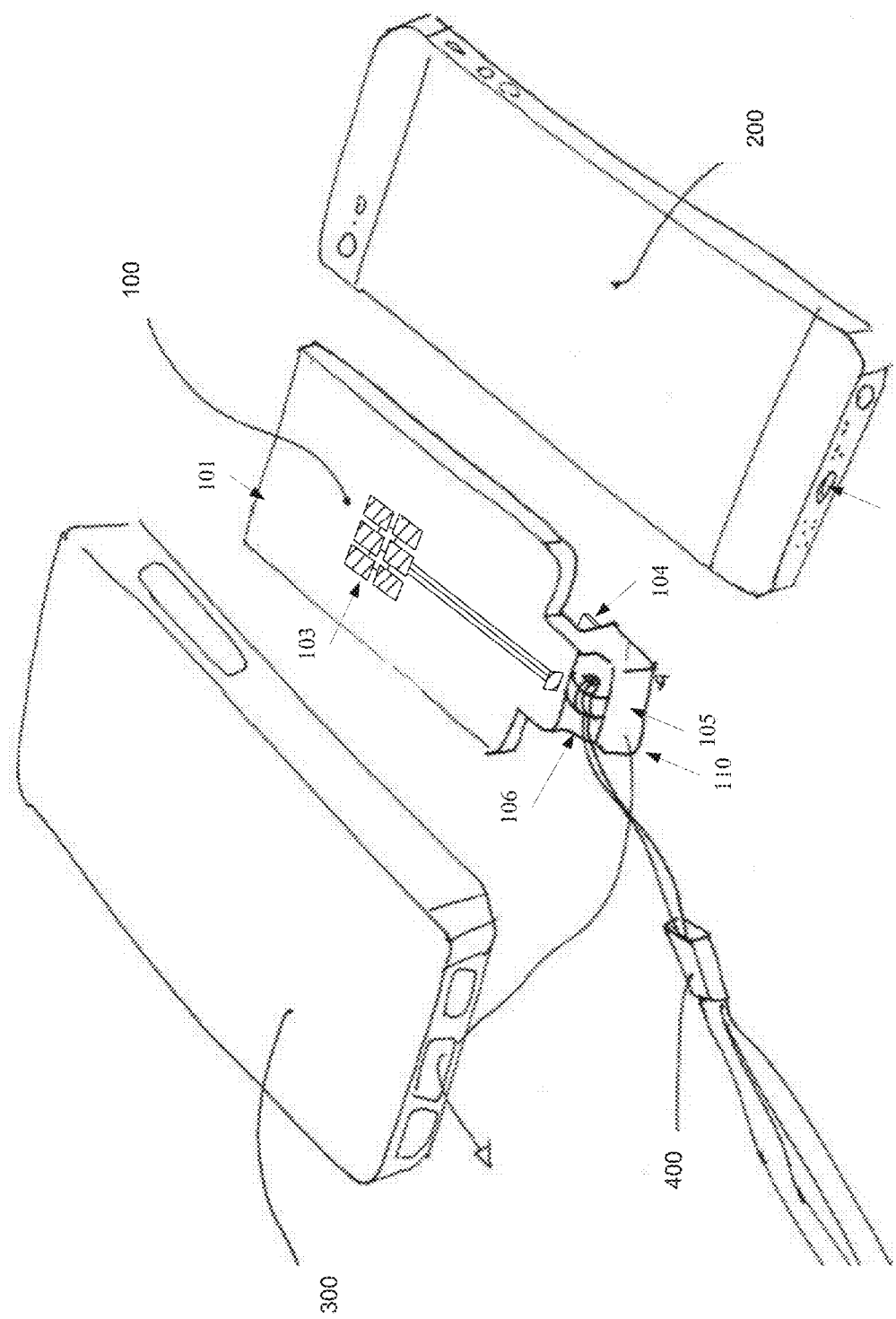
FIG. 1 is a schematic illustration of a supplementary element sized and shaped to fit between a back side of a handheld device, such as touch screen based cellular phone and/or a tablet, and a handheld device cover, for example a single piece handheld device cover, while the handheld device cover is on the handheld device, according to some embodiments of the present invention.

The present invention, in some embodiments thereof, relates to handheld devices and, more particularly, but not exclusively, to handheld devices which are protected by protective covers.

According to some embodiments of the present invention, there are provided supplementary elements for a handheld device and methods for the fabrication thereof. Each supplementary element has a board with one or more electronic component(s) embedded or otherwise placed therein and/or thereon and a lateral mount with a data and/or power connector that is connected to the electronic component(s) and fixated to the board in a manner that allows placing the supplementary element between a handheld device and its cover. Optionally, the width of the board is less than 0.6 millimeters, for example less than 0.3 millimeters. Optionally, the lateral mount is shaped to fit in an opening of the handheld cover that is designed to be located in front of an opening of a connector of the handheld device. For example, the lateral mount supports a male connector so that its tip faces a female connector of the handheld device when the lateral mount is located in the opening of the cover and the board is placed between the handheld device and the cover.

Optionally, the electronic component(s) includes an inductive charger module, a wireless communication module, a wireless identification module and/or the like.

Optionally, the lateral mount has a thin portion to allow the placing thereof in the opening of the cover without deforming the cover. Optionally, the lateral mount is L shaped. Optionally, the lateral mount includes an aperture for receiving a cord, such as a lanyard.

Optionally, the board is used as a detachable cover back, optionally replaceable, of a handheld cover. In such embodiments the handheld cover includes a frame structure that is set to support the detachable cover back when being tightly coupled to a handheld device.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Reference is now made to FIG. 1 which is a schematic illustration of a supplementary element 100 having a connector element 104 for interfacing with a connector of a handheld device 200 and a board 101 having one or more electronic components 104 that is sized and shaped to fit between a back side of the handheld device 200 and a handheld device cover 300 while the handheld device cover 300 is on the handheld device 300, for instance as shown at FIGS. 2A-2F, according to some embodiments of the present invention. The board 101 is optionally a flat element. The handheld device cover 300 may be a single piece handheld device cover. As used herein, a handheld device may be a Smartphone, cellular phone, a tablet, a music player, a personal digital assistant, and/or any device having a front side with a display and a relatively flat back side. Exemplary Smartphones are the Apple iPhone™ models, Samsung Galaxy™ models and/or the like. Exemplary tablets are the Apple iPad™ models, Samsung Galaxy Tab™ models and/or the like.

According to some embodiments of the present invention, the supplementary element 100 includes the board 101, which is relatively flat, for example less than 0.3 millimeters (mm). The board 101 optionally has one or more electronic components 103 which are permanently assembled thereto, for example at a maximum width of less than 0.3 mm, for example less than 0.1 mm. The board 101 is optionally a printed circuit board (PCB) and/or includes a PCB. The electronic components 103 may be any electronic components which may be electronically connected in the PCB using conductive pathways, tracks, signal traces etched from copper sheets laminated onto a non-conductive substrate and/or the like. The length and width board 101 are set to fit into a space between the back side of the handheld device 200 and the handheld device cover 300 when the handheld device cover 300 is in use, namely when it is tightly coupled to the lateral sides of the handheld device 200. For example, the length and width of the board 101 are sized to fit between an iPhone 4 and a cover thereof and therefore are respectively less than 4.53 inches (115 mm) high and less than 2.31 inches (59 mm) wide. Optionally, the maximum width of the board 101 (with the electronic components) is less than 0.7 centimeter (CM), for example 0.9 mm, 0.2 mm, 0.4 mm, 0.6 mm or any intermediate or smaller size. The board 101 may be laminated or otherwise covered for achieving an aesthetic design and/or for protecting the wiring and the electronic components.

The supplementary element 100 further includes a connector element 110 having a male connector 104 that is electronically connected to the one or more electronic components 103 and configured to be connected to a lateral female connector 201 via an opening 202 on the lateral side of the handheld device 200, for example at the bottom and/or top of the handheld device 200. The lateral female connector 201 may be a power connector, a data connector, a dock connector, for example a universal serial bus (USB) connector, a FireWire™ connector (i.e. IEEE 1394 interface), and/or a Lightning connector, and/or the like.

Optionally, the connector element 110 includes a lateral mount 105 that is mechanically connected to the board 101 and fixates the tip of the male connector 104 to face the lateral female connector 201 when the board 101 is placed over and in parallel to the back side of the handheld device 200. The lateral mount 105 may be molded, adhered and/or otherwise attached, optionally permanently, to the board 101.

As in the common practice, a handheld device cover, such as 300, has one or more openings which are located to face and encircle one or more connector openings of the handheld device 200 when the handheld device cover 300 is on the handheld device 200. This design allows charging and/or transferring data without requiring from a user to remove the device cover 300 from the handheld device 200. The lateral mount 105 is sized to fit into an opening of the handheld device cover 300 that is adapted to encircle a connector opening. For example, as shown at FIG. 1, the lateral mount 105 may have a thin potion, referred to herein as a neck 106, which is sized to fit the lateral mount 105 in the gap between the lateral side of the handheld device 200 and the lateral side of the cover of the handheld device 200. For example, the neck 106 is less than a millimeter (mm) to few millimeters wide, for example 1 mm and 3 mm or any intermediate or smaller width. This neck 106 allows threading the lateral mount 105 via the opening of the device cover 300, in the opening that is set to face the opening of the lateral female connector 201 of the handheld device 200. In such embodiments, the male connector 104 may be connected to the lateral female connector 201 when the supplementary element is located between the back side of the handheld device 200 and the handheld device cover 300 without substantially deforming the elastic structure of the handheld device cover 300 and/or require a reshaping thereof, for example as shown at FIGS. 2A-2F.

Optionally, for example as shown at FIG. 1, the lateral mount 105 has an L shape, optionally rounded in the center. In this embodiment, the tip of the L shape is fixated to the board 101.

Optionally, the lateral mount 105 is a detachable element that can be added and/or removed during the locating of the board between the handheld cover 300 and the handheld device 200.

Optionally, the lateral mount 105 is a rigid element, for example casted with the board 101 as a single element. Optionally, at least a portion of the lateral mount 105, for example the neck 106, has a higher elasticity coefficient than another portion of the lateral mount 105. This allows deforming the lateral mount 105 during the locating of the supplementary element 100 between the back side of the handheld device 200 and the handheld device cover 300. Optionally, the lateral mount 105 has a high elasticity coefficient, for example made of rubber, resin or silicon than another portion of the lateral mount 105. This allows deforming the lateral mount 105 during the locating of the supplementary element 100 between the back side of the handheld device 200 and the handheld device cover 300.

Optionally, the lateral mount 105 has an aperture that is sized and shaped to receive a cord, such as a lanyard, for example as shown at 400. This allows using the supplementary element 100 for adding a cord aperture to a handheld device without a cord aperture and/or handheld device with a cord aperture that is not located in front of a lateral opening, for example as depicted in FIG. 1. It should be noted that in such embodiment, the board 101 is a non PCB board, such as a board without electronic components and used as means for providing a cord aperture.

Reference is also made to FIGS. 2A-2E which are schematic illustrations of a supplementary element located between a back side of an exemplary handheld device (e.g. Smartphone) and a handheld device cover (e.g. single piece cover), according to some exemplary embodiments of the present invention. The exemplary supplementary element is fitted between a back side of a touch screen based Smartphone and a single piece cover, which is optionally elastic. As depicted in FIG. 2D, which is a blowup of a segment of FIG. 2C, the board comprises an isolating plate, optionally with a thickness of about 0.5 mm, a PCB, optionally with a thickness of about 0.3 mm, electronic components which are embedded in the PCB with the highest thickness of about 0.9 mm a PCB, optionally with a thickness of about 0.3 mm. The thickness of such an exemplary board 101 sums to 2.2 mm. This board is fitted in an exemplary handheld cover with a back panel having a thickness of less than 0.7 mm. In this example, a lateral mount 353 is connected to the board and has a length of about 10 mm which includes an aperture 351 for receiving a cord and an integrated male connector 352.

As described above, the board 101 is a PCB that includes one or more electronic components 103 which are connected to the connector element 104. The connector element 104 is optionally a male connector that is connected to a female connector of the handheld device 200 and may be used use to charge the handheld device 200 and/or to transfer and/or receive data from the handheld device 200. As shown at FIG. 2E, the only visual sign of the supplementary element to an observer is the lateral mount 353 that protrudes from a lateral opening of the handheld cover.

Reference is now made, once again, to FIG. 1. Optionally, the electronic components 103 include an inductive charger module, for example an inductive charger that includes one or more inductive coils and one or more charging circuits which are electronically connected to the male connector element 104. In use, power inductively transferred to the inductive coil(s) is wired via the to the male connector element 104 via the charging circuits.

Optionally, the electronic components 103 include a wireless communication module which interfaces with one or more application(s) hosted on the handheld device 200 and set to receive and/or transfer data such as images text and/or binary data from and/or to one or more other devices and/or tags. For example, the wireless communication module is a near field communication (NFC) module that is set to receive and/or transmit data from and/or to NFC enabled devices and/or NFC tags. In another example, the wireless communication module is a radio frequency identifier (RFID) module that is set to receive and/or transmit data from and/or to RFID enabled devices and/or RFID tags.

Optionally, the electronic components 103 include one or more electrochemical cells, for example battery.

Figures 3A, 3B, 3C:
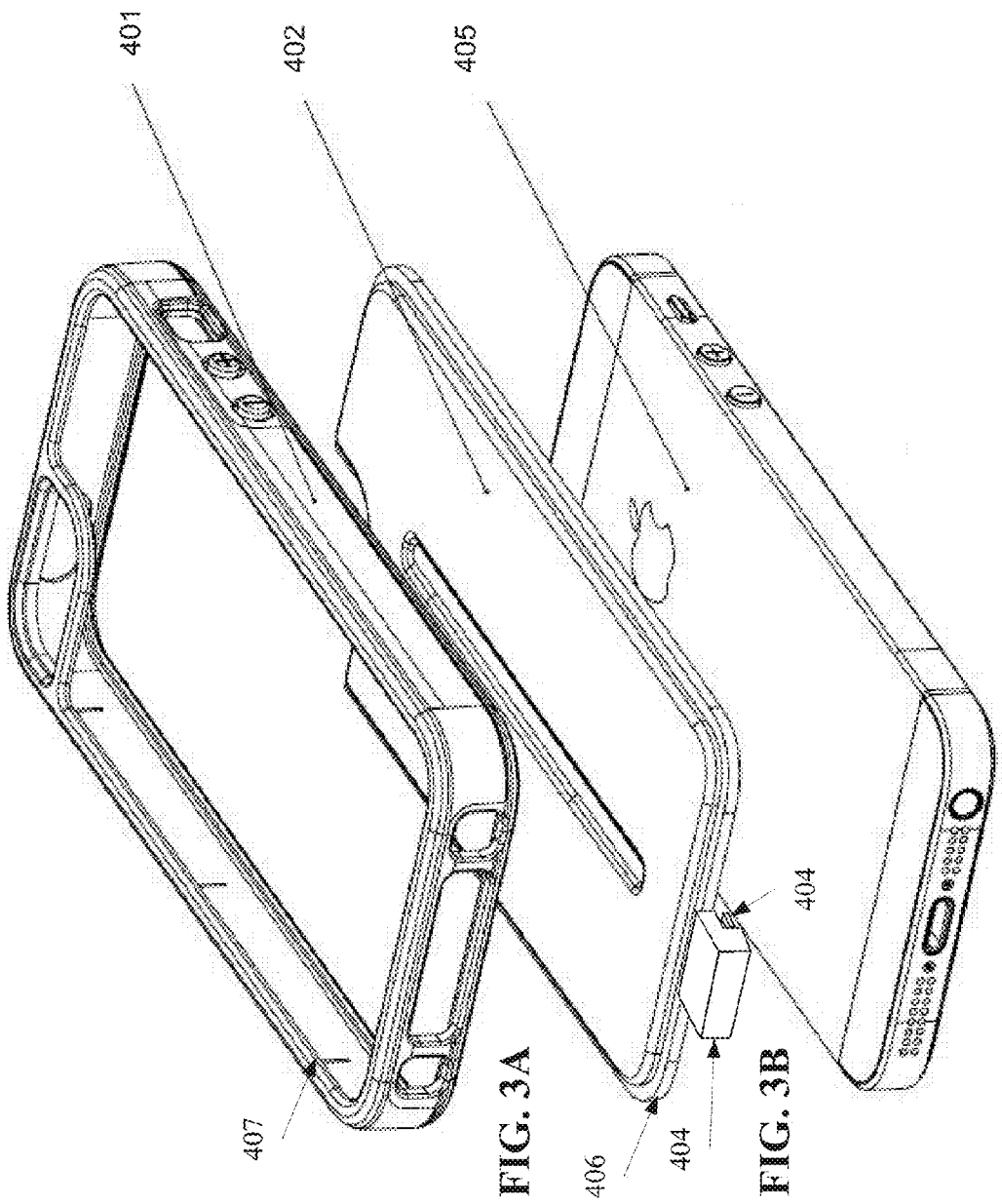
FIGS. 3A-3C are schematic illustrations of an exemplary lateral cover structure that is sized and shaped to be tightly coupled to the lateral side of a handheld device, according to some embodiments of the present invention.

According to some embodiments of the present invention, the board 101 is placed in a detachable cover back of a handheld cover for a handheld device. For example, FIGS. 3A-3C are schematic illustrations of an exemplary lateral cover structure 401 that is sized and shaped to be tightly coupled to the lateral side of a handheld device 405, for example such as a frame case, a back cover 402 having electronic components and a male connector element 403, and a lateral mount 404, for example similar to the above described electronic components and male connector element 403, and lateral mount, and the exemplary handheld device 405, iPhone 5™ according to some embodiments of the present invention. In such an embodiment, the detachable cover back 402 to which the lateral mount 404 and optionally the electronic components is fixated has a recess 406 that matches a projection 407 in the frame 401. In such embodiments, the detachable cover back 402 may be provided in a kit that includes one or more additional detachable cover backs, optionally without electronic components, the male connector element, and/or the lateral mount. This allows the client to replace cover backs according to a desired use and/or design.

Figure 4:
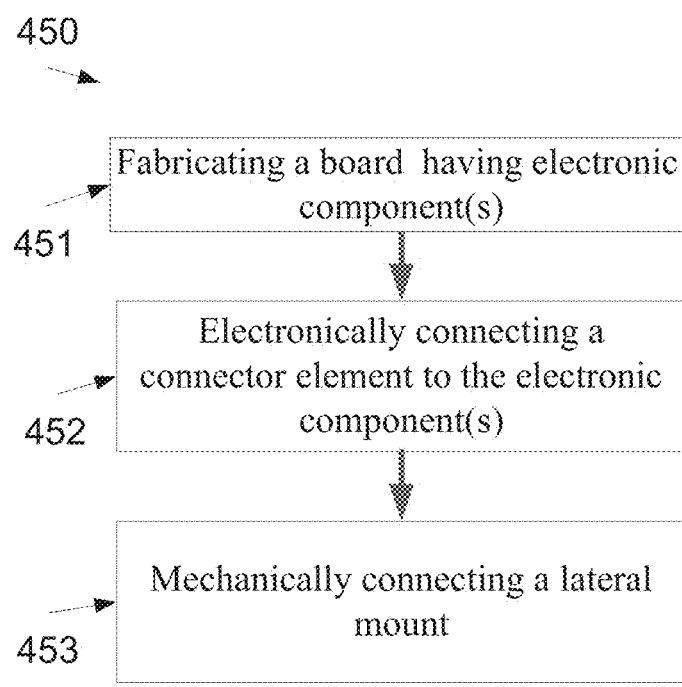
FIG. 4 is a flowchart of a method of manufacturing a supplementary element for a handheld device, according to some embodiments of the present invention.

Reference is now made to FIG. 4, which is a flowchart of a method of manufacturing a supplementary element for a handheld device, for example a supplementary element as described above and depicted in FIGS. 1-3C, according to some embodiments of the present invention. First, as shown at 451, a board having one or more electronic components which are permanently assembled thereto is fabricated, for example as a flat element that includes a PCB, such as 101, and/or as a PCB, for example using known fabrication techniques. Optionally, the board has a thickness of less than 0.6 centimeter and a first width and height which are shorter than a second width and height of a target handheld device having an opening of a lateral female connector. Now, as shown at 452, a connector element having a male connector configured to be connected to the lateral female connector of the handheld device is electronically connecting to the electronic component(s). Now, as shown at 453, a lateral mount is mechanically connecting to the board so that the lateral mount fixates a tip of the male connector to face the lateral female connector of the handheld device when the board is placed over and in parallel to the back side of the handheld device. As described above, the formed supplementary element is sized and shaped to fit between the back side of a handheld device and a handheld device cover while the handheld device cover is tightly coupled to the lateral side of the handheld device.

It is expected that during the life of a patent maturing from this application many relevant methods and systems will be developed and the scope of the term a fabrication, a module, a processor and an electronic component is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A supplementary element sized and shaped to fit between a back side of a handheld device and a handheld device cover while the handheld device cover is on the handheld device, comprising:
    a board having at least one electronic component which are permanently assembled, said board is sized and shaped to fit between a back side of a handheld device and a handheld device cover while said handheld device cover is tightly coupled to a lateral side of said handheld device, said lateral side having an opening of a lateral female connector;
    a connector element having a male connector that is electronically connected to said at least one electronic component and configured to be connected to said lateral female connector; and
    a lateral mount mechanically connected to said board and fixates a tip of said male connector to face said lateral female connector when said board is placed over and in parallel to said back side.

2. The supplementary element of claim 1, wherein said board comprises a printed circuit board (PCB) in which said at least one electronic component is wired.

3. The supplementary element of claim 1, wherein said board having a first width and height which are shorter than a second width and height of said handheld device.

4. The supplementary element of claim 1, wherein said board having a thickness of less than 0.6 centimeter.

5. The supplementary element of claim 1, wherein said board having a thickness of less than 0.3 centimeter.

6. The supplementary element of claim 1, wherein said lateral female connector comprises a power connector.

7. The supplementary element of claim 1, wherein said lateral mount is sized and shaped to pass through in an opening of a single piece handheld device cover, said single piece handheld device cover is sized and shaped to be tightly coupled to said back side and said opening is sized to encircle said lateral female connector.

8. The supplementary element of claim 1, wherein said at least one electronic component comprises at least one inductive coil and at least one charging circuit electronically connected to said male connector.

9. The supplementary element of claim 1, wherein said at least one electronic component comprises a wireless communication module for establishing a wireless communication with at least one of a proximate device and a tag.

10. The supplementary element of claim 9, wherein said wireless communication module is a near field communication (NFC) module.

11. The supplementary element of claim 9, wherein said wireless communication module is a radio frequency identifier (RFID) tag.

12. The supplementary element of claim 1, wherein said at least one electronic component comprises at least one electrochemical cell.

13. The supplementary element of claim 1, wherein said lateral mount having an aperture that is sized and shaped to receive a cord.

14. The supplementary element of claim 1, wherein said handheld device cover having a frame structure that supports a replaceable back cover, said board being integrated into said replaceable back cover.

15. The supplementary element of claim 1, wherein said replaceable back cover having a recess that matches a lateral projection in said frame structure.

16. A supplementary element for a handheld device, comprising:
    a board having a thickness of less than 0.6 centimeter and a first width and height which are shorter than a second width and height of a handheld device having a back side, a front side, and a lateral side having an opening of a lateral female connector; and
    a lateral mount that is mechanically connected to said board having an aperture that is sized and shaped to receive a cord;
    wherein said supplementary element is sized and shaped to fit between said back side and a handheld device cover while said handheld device cover is tightly coupled to said lateral side and so that said lateral mount is located to cover said opening.

17. The supplementary element of claim 16, wherein said lateral mount is sized and shaped to pass through in an opening of a single piece handheld device cover, said single piece handheld device cover is sized and shaped to be tightly coupled to said back side and said opening is sized to encircle said lateral female connector.

18. A method of manufacturing a supplementary element for a handheld device, comprising:
    fabricating a board having at least one electronic component which are permanently assembled thereto, said board having a thickness of less than 0.6 centimeter and a first width and height which are shorter than a second width and height of a handheld device having a back side, a front side, and a lateral side having an opening of a lateral female connector;
    electronically connecting a connector element having a male connector configured to be connected to said lateral female connector to said at least one electronic component; and
    mechanically connecting a lateral mount to said board so that said lateral mount fixates a tip of said male connector to face said lateral female connector when said board is placed over and in parallel to said back side;
    wherein said supplementary element is sized and shaped to fit between said back side and a handheld device cover while said handheld device cover is tightly coupled to said lateral side.

* * * * *